United States Patent
Yamaguchi et al.

(10) Patent No.: US 11,136,668 B2
(45) Date of Patent: Oct. 5, 2021

(54) FILM-FORMING APPARATUS AND FILM-FORMING METHOD

(71) Applicant: TOKYO ELECTRON LIMITED, Tokyo (JP)

(72) Inventors: Tatsuya Yamaguchi, Nirasaki (JP); Reiji Niino, Nirasaki (JP); Yoji Iizuka, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/390,903

(22) Filed: Apr. 22, 2019

(65) Prior Publication Data
US 2019/0323124 A1    Oct. 24, 2019

(30) Foreign Application Priority Data

Apr. 24, 2018  (JP) .............................. JP2018-083406

(51) Int. Cl.
*C23C 16/46*    (2006.01)
*C23C 16/455*   (2006.01)
(Continued)

(52) U.S. Cl.
CPC .... *C23C 16/45563* (2013.01); *C23C 16/4405* (2013.01); *C23C 16/4584* (2013.01); *C23C 16/46* (2013.01); *H01L 21/02118* (2013.01); *H01L 21/02205* (2013.01); *H01L 21/02271* (2013.01); *H01L 21/67103* (2013.01); *H01L 21/68764* (2013.01); *H01L 21/68785* (2013.01)

(58) Field of Classification Search
CPC .......... C23C 16/45563; C23C 16/4405; C23C 16/4584; C23C 16/46; H01L 21/02118; H01L 21/02205; H01L 21/02271; H01L 21/67103; H01L 21/68764; H01L 21/68785

See application file for complete search history.

(56) References Cited

U.S. PATENT DOCUMENTS

| | | | |
|---|---|---|---|
| 2006/0073644 A1* | 4/2006 | Atoji ................. | H01L 21/76259 438/147 |
| 2009/0124083 A1* | 5/2009 | Nodera ................. | C23C 16/452 438/694 |
| 2016/0122872 A1* | 5/2016 | Kato ....................... | C23C 16/52 427/8 |

FOREIGN PATENT DOCUMENTS

JP          2017-076784          4/2017

* cited by examiner

*Primary Examiner* — Timor Karimy
(74) *Attorney, Agent, or Firm* — Nath, Goldberg & Meyer; Jerald L. Meyer; Tanya E. Harkins

(57) ABSTRACT

There is provided a film-forming apparatus, comprising: a process container in which a vacuum atmosphere is formed; a rotary table installed in the process container, the rotary table having substrate mounting regions formed on a side of a top surface of the rotary table and configured to mount a plurality of substrates, and the rotary table including a rotary mechanism configured to rotate the substrate mounting regions around a rotary shaft; a heating mechanism configured to heat the substrates mounted on the substrate mounting regions; a gas supply part installed to face a moving region where the substrates move when the rotary table rotates and including gas discharge holes formed to cross the moving region, the gas discharge holes being configured to discharge a first film-forming gas and a second film-forming gas; and an exhaust part configured to exhaust an interior of the process container.

4 Claims, 8 Drawing Sheets

(51) Int. Cl.
  *C23C 16/458* (2006.01)
  *C23C 16/44* (2006.01)
  *H01L 21/67* (2006.01)
  *H01L 21/687* (2006.01)
  *H01L 21/02* (2006.01)

Epoxy bond

Urea bond

Imide bond

FILM-FORMING APPARATUS AND FILM-FORMING METHOD

CROSS-REFERENCE TO RELATED APPLICATION

This application is based upon and claims the benefit of priority from Japanese Patent Application No. 2018-083406, filed on Apr. 24, 2018, the entire contents of which are incorporated herein by reference.

TECHNICAL FIELD

The present disclosure relates to a film-forming apparatus and a film-forming method.

BACKGROUND

In processes of manufacturing a semiconductor device, a film-forming process is often carried out by reacting a processing gas supplied to a substrate such as a semiconductor wafer (hereinafter, referred to as a "wafer").

In the related art, as an example of the film-forming process, an example is described in which an organic film is formed by supplying vapors of first and second reactants containing organic reactants that react with each other to a substrate supported by a substrate support by horizontal through-flow.

SUMMARY

Some embodiments of the present disclosure provide a technique for enhancing productivity and improving in-plane and inter-plane uniformities of film thickness of a film formed on a substrate, in a film forming apparatus in which a film made of a film material is formed by supplying film-forming gases that react with each other to become the film material to the substrate.

According to one embodiment of the present disclosure, there is provided a film-forming apparatus including: a process container in which a vacuum atmosphere is formed; a rotary table installed in the process container, the rotary table having substrate mounting regions formed on a side of a top surface of the rotary table and configured to mount a plurality of substrates, and the rotary table including a rotary mechanism configured to rotate the substrate mounting regions around a rotary shaft; a heating mechanism configured to heat the substrates mounted on the substrate mounting regions; a gas supply part installed to face a moving region where the substrates move when the rotary table rotates and including gas discharge holes formed to cross the moving region over a range from a rotation center side to a peripheral side of the rotary table, the gas discharge holes being configured to discharge a first film-forming gas and a second film-forming gas toward a side of the rotary table, and the first film-forming gas and the second film-forming gas being adsorbed to surfaces of the substrates heated by the heating mechanism and reacting with each other to form a film material; and an exhaust part configured to exhaust an interior of the process container, wherein the first film-forming gas and the second film-forming gas are simultaneously supplied to overlapping regions of the moving region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film-forming apparatus according to one embodiment of the present disclosure will be described. This film-forming apparatus performs a film-forming process in which a film made of a film material of a reactant is formed on a surface of a wafer by supplying a first film-forming gas containing a first monomer and a second film-forming gas containing a second monomer, which react with each other, to the wafer as a substrate. In the embodiment, a difunctional acid anhydride, for example, PMDA ($C_{10}H_2O_6$: pyromellitic anhydride), is used as the first monomer and a difunctional amine, for example, ODA ($C_{12}H_{12}N_2O$: 4, 4'-diaminodiphenyl ether), is used as the second monomer to produce a film material made of polyimide.

Figure 1:
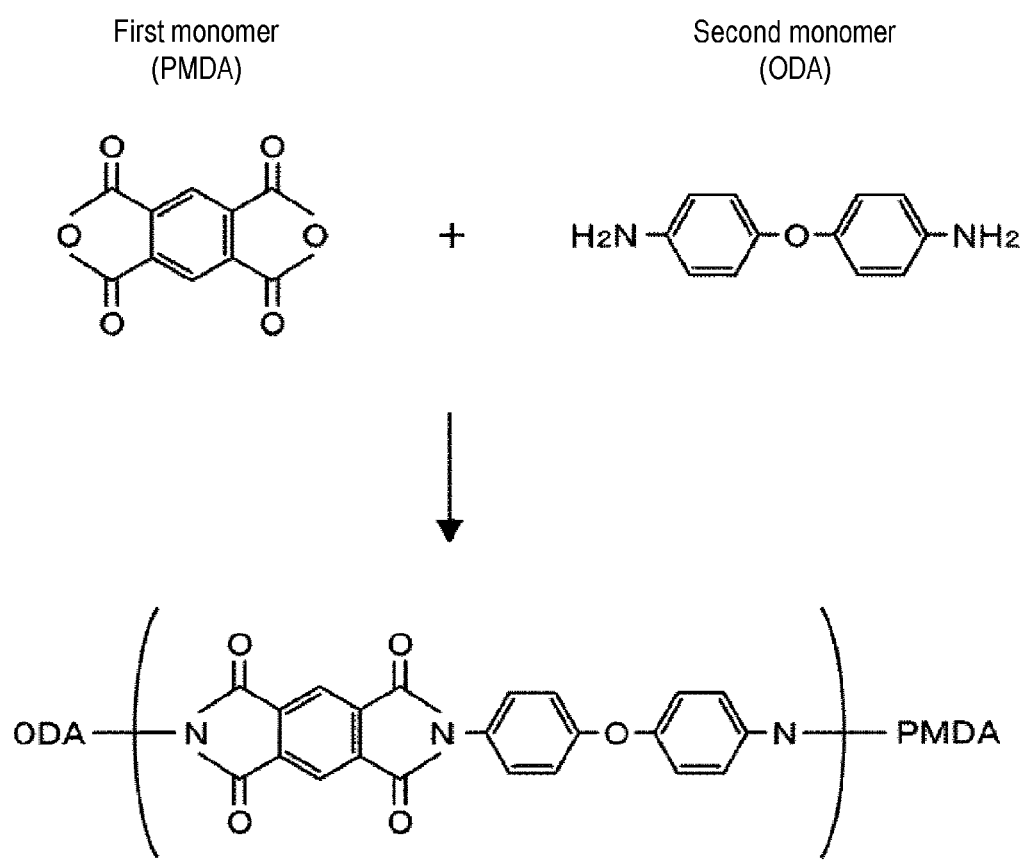
FIG. 1 is a reaction diagram illustrating a process of producing polyimide according to an embodiment of the present disclosure.

The synthesis of polyimide will be described. As illustrated in FIG. 1, specifically, PMDA has two functional groups each made of a 5-membered ring in which four carbon elements (C) and one oxygen element (O) are annularly connected to each other by a single bond, and another oxygen element is connected to each of the carbon elements adjacent to the oxygen element by a double bond. The oxygen elements constituting the 5-membered ring are each arranged so as to face outward, and benzene sharing two carbon elements of each functional group is interposed between the two functional groups to form an aromatic monomer. The 5-membered ring is for forming an imide ring.

In the ODA, two amino groups (—NH$_2$) each having one nitrogen element (N) and two hydrogen elements (H) are arranged, in which these nitrogen elements are respectively bonded to one end side and the other end side of diphenyl ether. In FIG. 1, the descriptions of the carbon elements and the hydrogen elements are omitted. When these two kinds of monomers are mixed with each other, a polyamide acid as a precursor is produced so that dehydration condensation occurs by heat treatment (heating) of the precursor and polyimide illustrated in the lower stage of FIG. 1 is synthesized.

Figure 2:
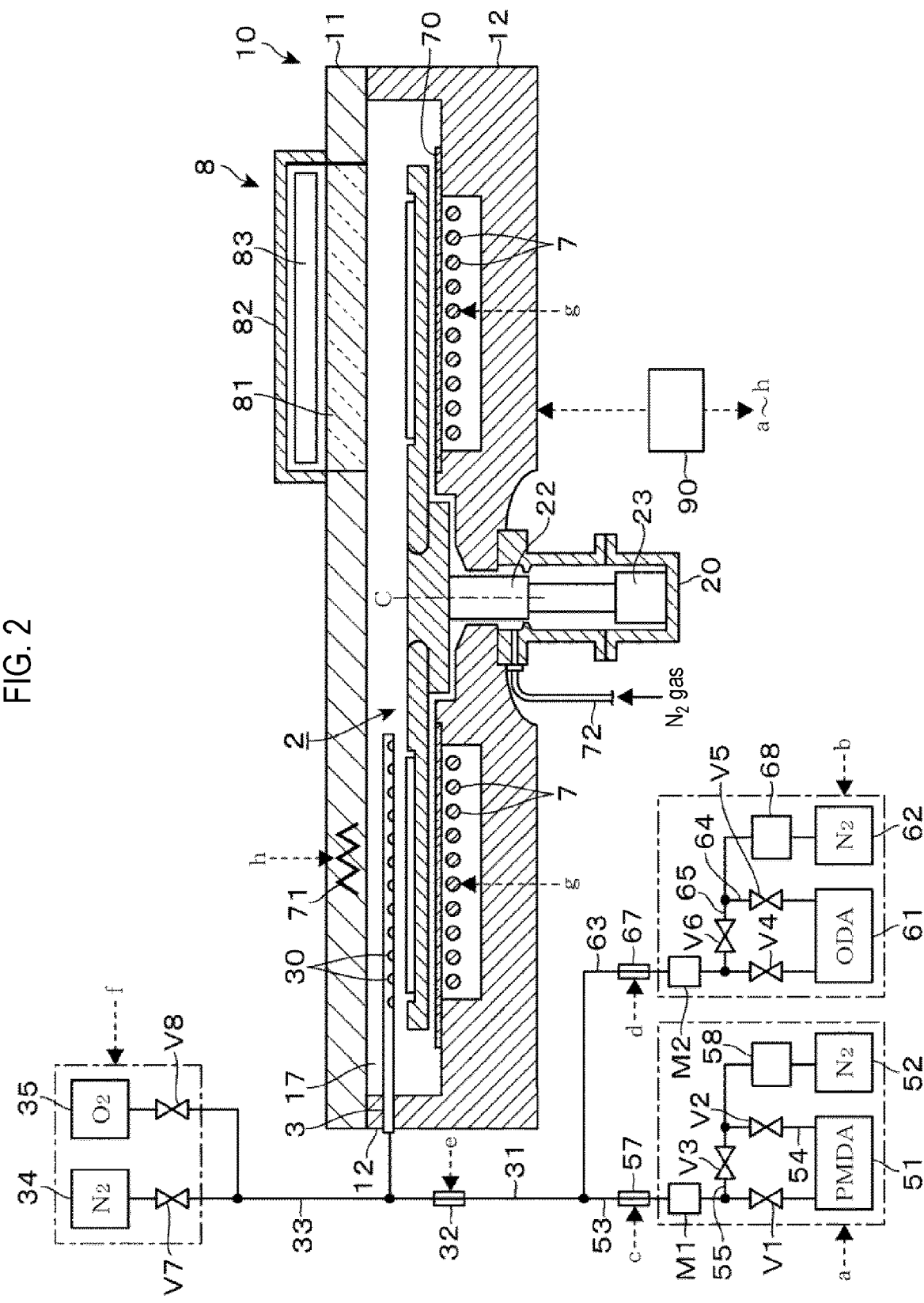
FIG. 2 is a longitudinal sectional view of a film-forming apparatus according to an embodiment of the present disclosure.
Figure 3:
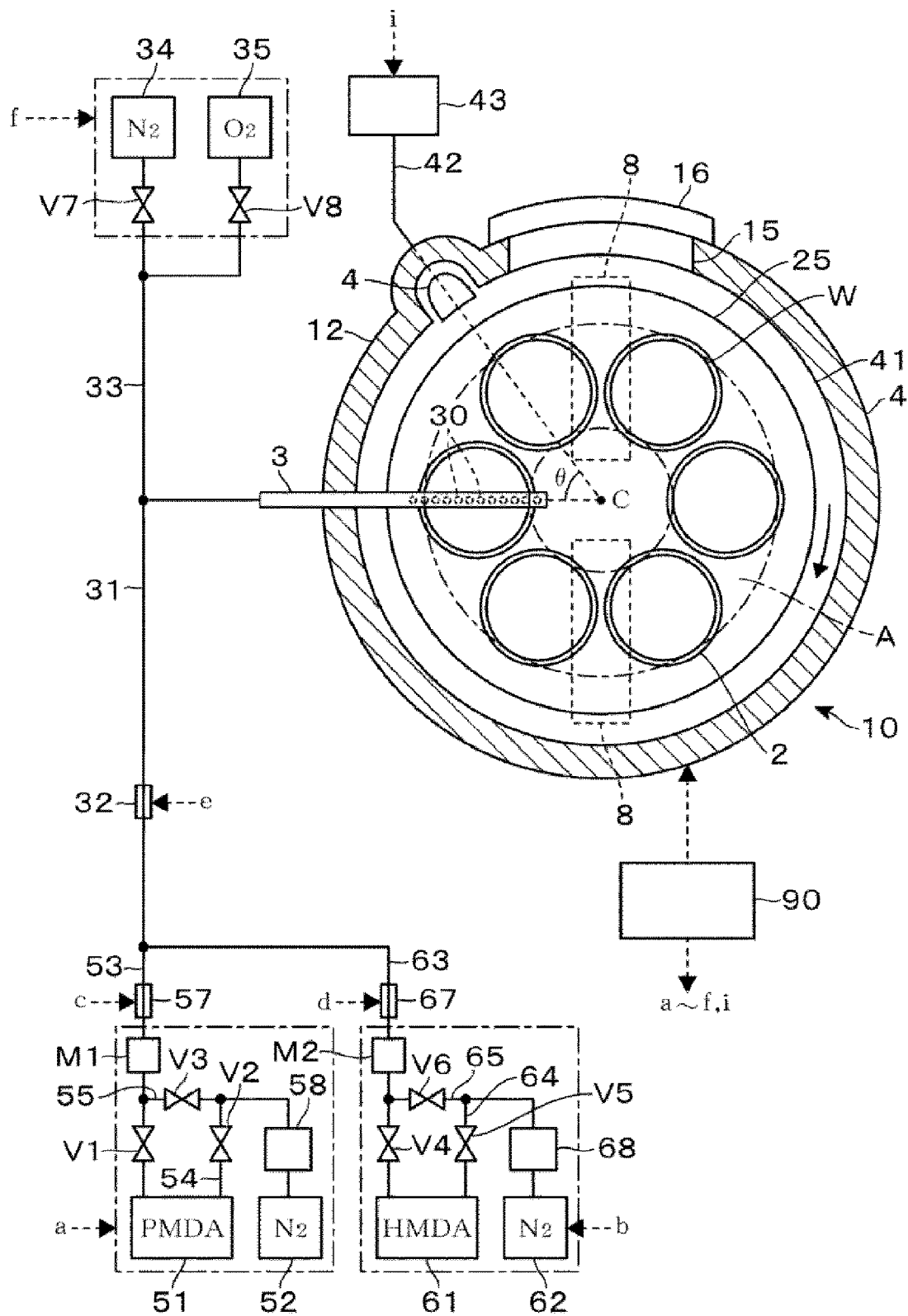
FIG. 3 is a transverse plan view of the film-forming apparatus.

Next, a configuration of the film-forming apparatus will be described. As illustrated in FIGS. 2 and 3, the film-forming apparatus includes a flat, substantially circular vacuum container (process container) 10 in which a vacuum atmosphere is formed, and the vacuum container 10 is constituted by a container body 12 that forms a sidewall and a bottom portion, and a ceiling plate 11. A circular rotary table 2 for horizontally mounting a plurality of wafers W each having a diameter of 300 mm is installed in the vacuum container 10. As illustrated in FIG. 2, mounting parts (substrate mounting regions) 24 configured as six circular recesses are installed on a top surface (one surface side) of the rotary table 2 along a circumferential direction (rotational direction) of the rotary table 2, in which the wafers W are mounted in the recesses of the respective mounting parts 24.

A rotary mechanism 23 is installed in the central portion of the rear surface of the rotary table 2 via a rotary shaft 22, and the rotary table 2 is rotated around the vertical axis (the center C of the rotary table 2 illustrated in FIG. 2) in a clockwise direction, when viewed from the top side, during the film-forming process. Therefore, the rotary table 2 is configured to rotate the mounting parts 24, on which the wafers W are mounted, around the rotary shaft 22. When the rotary table 2 on which the wafers W are mounted is rotated, the wafers W mounted on the mounting parts 24 are rotated to move in a moving region A indicated by an alternate long and short dash line in FIG. 3. In FIG. 2, reference numeral 20 denotes a case body that stores the rotary shaft 22 and the rotary mechanism 23. A purge gas supply pipe 72 for supplying a nitrogen gas as a purge gas to a lower region of the rotary table 2 is connected to the case body 20.

As illustrated in FIG. 2, a plurality of heaters 7, which are heating mechanisms, are concentrically installed below the rotary table 2 at the bottom of the vacuum container 10 so that the wafers W mounted on the respective mounting parts 24 are heated. Furthermore, in FIG. 2, reference numeral 70 denotes a cover member for covering the upper sides of the heaters 7. In addition, as illustrated in FIG. 3, a transfer port 15 for the wafers W is opened on the sidewall of the vacuum container 10, and is configured to be opened and closed by a gate valve 16. A position facing the transfer port 15 in the vacuum container 10 is a transfer position of the wafers W. Elevating pins for transfer for lifting up the wafers W from its rear surface by passing through the mounting parts 24 on the lower side of the rotary table 2, and an elevating mechanism (none of which are shown) are installed in a portion corresponding to the transfer position. The wafers W are transferred to the transfer position by a substrate transfer mechanism (not shown) installed outside the vacuum container 10 via the transfer port 15, and then transferred to the mounting parts 24 by cooperative action of the substrate transfer mechanism and the elevating pins.

In addition, a gas supply nozzle 3, which is a gas supply part for supplying the first film-forming gas containing PMDA and the second film-forming gas containing ODA toward the rotary table 2, is installed on the sidewall of the vacuum container 10.

The gas supply nozzle 3 has a cylindrical shape with its leading end sealed, and is installed toward the diameter direction of the rotary table 2 so that it extends from the outer peripheral wall of the vacuum container 10 toward the center thereof to cross the moving region A described above where the wafers W move when the rotary table 2 rotates. Furthermore, the gas supply nozzle 3 is prepared at a position above the rotary table 2 so as to face the moving region A of the wafers W.

A plurality of gas discharge holes 30 arranged at equal intervals along a longitudinal direction are provided at a lower surface of the gas supply nozzle 3 having the cylindrical shape. Based on the arrangement of the gas supply nozzle 3 described above, it can be said that the gas discharge holes 30 are formed over a range from the rotation center side to the peripheral side of the rotary table 2 crossing the moving region A.

A gas supply pipe 31 is connected to a base end portion of the gas supply nozzle 3 located outside the vacuum container 10. The gas supply pipe 31 branches into two gas introduction pipes 53 and 63 at its upstream side. An upstream side of the gas introduction pipe 53 is connected to a PMDA vaporizer 51 via a flow rate adjustment part M1 and a valve V1 in this order.

PMDA is stored in a solid state in the PMDA vaporizer 51 which has a heater (not shown) for heating the PMDA. Furthermore, one end of a carrier gas supply pipe 54 is connected to the PMDA vaporizer 51, and the other end of the carrier gas supply pipe 54 is connected to a nitrogen (N$_2$) gas supply source 52 via a valve V2 and a gas heating part 58 in this order. With this configuration, an N$_2$ gas, which is a carrier gas, is supplied to the PMDA vaporizer 51 in a heated state, and the PMDA heated and vaporized in the PMDA vaporizer 51 and the N$_2$ gas are mixed with each other and introduced as a mixture gas into the gas supply nozzle 3 as the first film-forming gas.

Furthermore, the downstream side of the gas heating part 58 and the upstream side of the valve V2 in the carrier gas supply pipe 54 are branched to form a gas supply pipe 55, and the downstream end of the gas supply pipe 55 is connected to the downstream side of the valve V1 of the gas introduction pipe 53 and the upstream side of the flow rate adjustment part M1 via a valve V3. With this configuration, when the aforementioned first film-forming gas is not supplied to the gas supply nozzle 3, the N$_2$ gas heated by the gas heating part 58 can be introduced into the gas supply nozzle 3 by bypassing the PMDA vaporizer 51.

On the other hand, the other end of the gas introduction pipe 63 is connected to an ODA vaporizer 61 via a flow rate adjustment part M2 and a valve V4 in this order. ODA is stored in the ODA vaporizer 61 in a liquid (or granular solid) state, which has a heater (not shown) for heating the ODA. In addition, one end of a carrier gas supply pipe 64 is connected to the ODA vaporizer 61, and the other end of the carrier gas supply pipe 64 is connected to an N$_2$ gas supply source 62 via a valve V5 and a gas heating part 68. With this configuration, an N$_2$ gas as a heated carrier gas is supplied to the ODA vaporizer 61 in a heated state, and the ODA heated and vaporized in the ODA vaporizer 61 and the N$_2$ gas are mixed with each other and can be introduced as a mixture gas into the gas supply nozzle 3 as the second film-forming gas.

Furthermore, the downstream side of the gas heating part 68 and the upstream side of the valve V5 in the carrier gas supply pipe 64 are branched to form a gas supply pipe 65, and the downstream end of the gas supply pipe 65 is connected to the downstream side of the valve V4 of the gas introduction pipe 63 and the upstream side of the flow rate adjustment part M2 via a valve V6. With this configuration, when the second film-forming gas is not supplied to the gas supply nozzle 3, the N$_2$ gas heated by the gas heating part 68 can be introduced to the gas supply nozzle 3 by bypassing the ODA vaporizer 61.

In order to prevent the PMDA and ODA in the film-forming gases, which flow, from being liquefied or adhered, for example, pipe heaters 32, 57, and 67 for heating the inside of the pipes are respectively prepared around the gas supply pipe 31 and the gas introduction pipes 53 and 63 inside the pipes. The temperatures of the film-forming gases discharged from the gas supply nozzle 3 are adjusted by the pipe heaters 32, 57, and 67. Furthermore, for convenience of illustration, although the pipe heaters 32, 57 and 67 are shown only in some of the pipes, it may be prepared in, for example, all the pipes, so as to prevent liquefaction.

In addition, one end of a cleaning gas supply pipe 33 for supplying a cleaning gas is connected to the gas supply pipe 31. The other end of the cleaning gas supply pipe 33 branches into two, and an N$_2$ gas supply source 34 and an oxygen (O$_2$) gas supply source 35 are respectively connected to respective end portions. Furthermore, in FIGS. 2 and 3, reference symbols V7 and V8 denotes valves.

With this configuration, an O$_2$ gas diluted with an N$_2$ gas can be supplied as the cleaning gas into the vacuum container 10 via the gas supply nozzle 3.

In addition, an exhaust port 4 is provided on a peripheral edge of the bottom surface of the vacuum container 10, namely at a position on the downstream side of the rotary table 2 in the rotational direction, when viewed from the position of the gas supply nozzle 3. An angle θ between the gas supply nozzle 3 installed in the diameter direction of the rotary table 2 and a straight line drawn from the exhaust port 4 toward the center C of the rotary table 2 may be within a range of 30 to 90°, and it may be set to, e.g., 60° in some embodiments. Furthermore, the position of the exhaust port 4 may be configured so that the angle θ is variable within the range of 30 to 90°. For example, when process parameters such as a selection of material, or a flow rate, a temperature or a pressure of a gas are changed, if the uniformity of concentration of the gas is biased, it is possible to improve the uniformity of concentration of the gas by adjusting the position of the exhaust port 4. One end of an exhaust pipe 42 is connected to the exhaust port 4, and a vacuum pump 43 is connected to the other end of the exhaust pipe 42.

Furthermore, a container heating part 71 for heating the vacuum container 10 to a film-forming inhibition temperature (240 degrees C.), which is higher than the heating temperature (200 degrees C.) of the wafers W, inhibits adsorption of the film-forming gases, and suppresses formation of polyimide, is installed in the ceiling plate 11. Thus, it is possible to suppress the formation of polyimide in the vacuum container 10.

In addition, the film-forming apparatus includes an ultraviolet irradiation part 8 for irradiating the rotary table 2 with ultraviolet rays to clean the rotary table 2. As illustrated in FIG. 2, the ultraviolet irradiation part 8 is installed along the diameter direction with the center C of the rotary table 2 interposed therebetween, when viewed from the top surface side. The ultraviolet irradiation part 8 has a structure in which an ultraviolet lamp 83 is arranged inside a lamp house 82, and is configured so that the surface of the rotary table 2 can be irradiated with ultraviolet rays through a transmission window 81 formed in the ceiling plate 11.

The film-forming apparatus having the aforementioned configuration includes a controller 90 as a computer, and the controller 90 includes a program, a memory, and a CPU. Commands (each step: a group of steps) for executing a process, which will be described later, on the wafers W are embedded in the program. This program is stored in a computer storage medium, for example, a compact disc, a hard disk, a magneto-optical disc, a DVD or the like, and is installed in the controller 90. The controller 90 controls operations of the respective parts of the film-forming apparatus by causing the program to output control signals to the respective parts. Specifically, control targets such as the exhaust flow rate by the vacuum pump 43, the flow rates of the respective gases supplied into the process container 10 by the flow rate adjustment parts M1 and M2, the supply of the N$_2$ gas from the N$_2$ gas supply sources 52 and 62, the supply power to each heater, and the like are controlled by the control signals.

In the film-forming apparatus according to the embodiment having the aforementioned configuration, the thickness of a film of polyimide formed on the surface of each wafer W is controlled by using the heating temperature of the wafer W and the supply amounts of the first film-forming gas and the second film-forming gas (partial pressures of the first film-forming gas and the second film-forming gas) as operation variables.

In an adsorption reaction in which the monomers reacting with each other are adsorbed to the surface of the wafer W to form a film material, the formation amount of the film material (hereinafter, also referred to as a "deposition amount") depends on an adsorption amount of each monomer to the wafer W. Furthermore, the adsorption amount of each monomer to the wafer W depends on a collision frequency (a collision amount per unit time) of each molecule of the first film-forming gas and the second film-forming gas which are the monomers. Therefore, the adsorption amount of each monomer to the wafer W can be controlled by the partial pressures of the first film-forming gas and the second film-forming gas.

Figure 4:
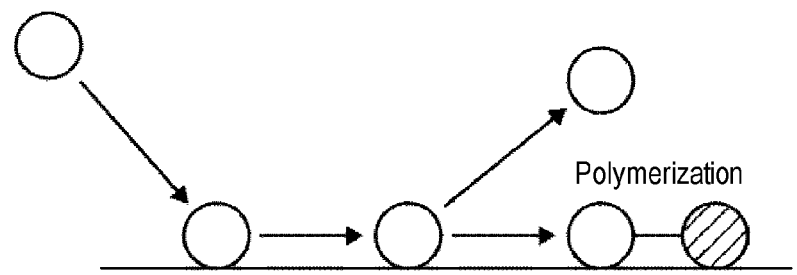
FIG. 4 is an explanatory diagram of a structure in which an adsorption amount of a film-forming gas adsorbed to a wafer changes.

On the other hand, when the monomers are observed at the molecular level, if the vibration energy of the monomers adsorbed to the surface of the wafer W becomes large, the monomers are desorbed from the surface of the wafer W. Therefore, as schematically illustrated in FIG. 4, a net amount of adsorption of the monomers adhered to the surface of the wafer W is determined by the balance between an amount of monomers that collide with the surface of the wafer W per unit time and an amount of monomers that are desorbed from the surface of the wafer W where the monomers have been adsorbed. And, when the time (adsorption retention time) during which the monomers of both film-forming gases are adsorbed to the wafer W becomes longer, the probability that the monomers adsorbed to the wafer W will react with each other is increased and the deposition amount is increased accordingly.

Therefore, for example, in a case where polyimide is produced by the adsorption reaction between PMDA and ODA, when the temperature of a member is heated to 240 degrees C. or higher, the desorption amount is larger than the adsorption amount of monomers per unit time and the net adsorption amount of the monomers on the surface of the member becomes almost zero. Accordingly, the gas supply nozzle 3, the pipeline at the upstream side thereof, and the vacuum container 10 other than the wafer W to be film-formed to are heated to a temperature of, e.g., 240 degrees C. (corresponding to the aforementioned film-forming inhibition temperature), it is possible to suppress deposition of the film material on the surfaces of these members even if the first and second film-forming gases are mixed and supplied.

To summarize the mechanism described above, when the supply amount (partial pressure) of each film-forming gas is increased, the adsorption amount of the monomer of the film-forming gas is increased and the deposition amount is thus increased, and when the supply amount (partial pressure) is decreased, the adsorption amount is decreased and the deposition amount is thus decreased. In addition, when the temperature of the wafer W is increased, the vibration energy of the monomer is increased, the desorption amount of the monomer is increased and the adsorption retention time becomes shortened, whereby the deposition amount is decreased. On the contrary, when the temperature of the wafer W is lowered (but, when the wafer is heated to the reaction temperature or higher), the desorption amount of the monomer is decreased and the adsorption retention time becomes longer, showing a tendency that the deposition amount is increased.

As discussed above, when film formation is performed by changing the supply amount of each film-forming gas or the temperature of the wafer W, the saturated vapor pressures of these film-forming gases should be noted. If the pressures exceed saturated vapor pressure curves of the film-forming gases under a constant temperature condition, there is a possibility that the film-forming gases are liquefied and precise film thickness control may not be performed. Therefore, when increasing the adsorption amounts of the film-forming gases, the partial pressures of the film-forming gases and the heating temperature of the wafer W need to be adjusted within a range where the film-forming gases do not liquefy.

Figure 5:
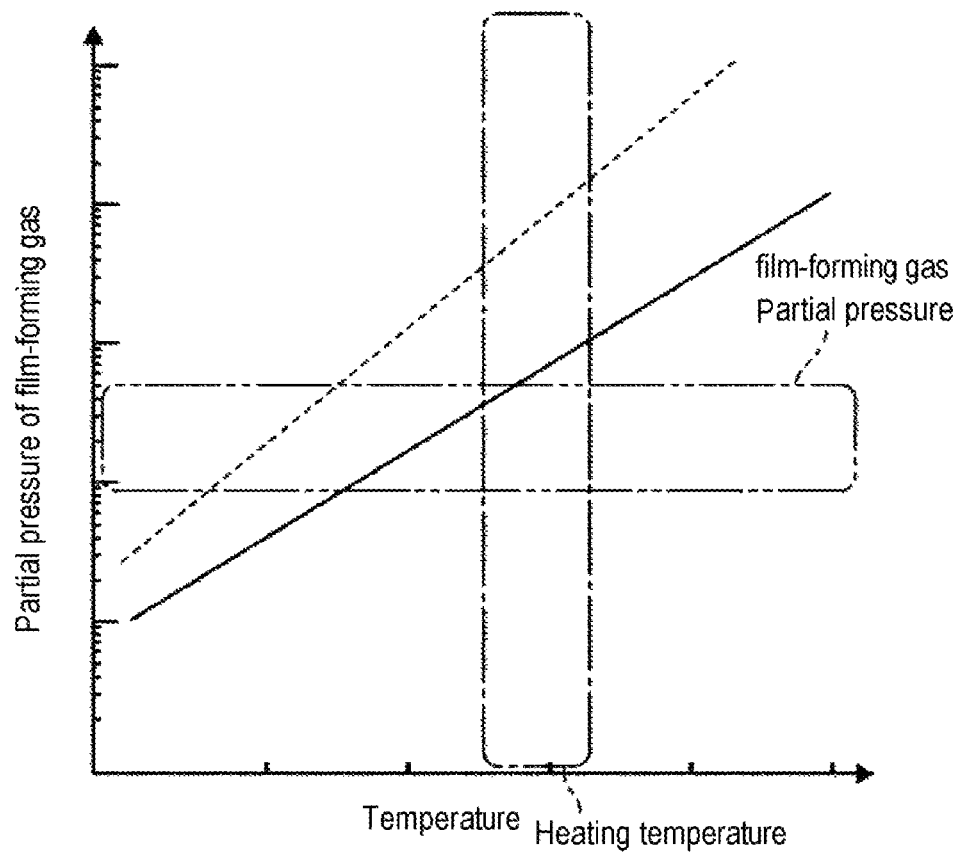
FIG. 5 is an explanatory view illustrating a concept of setting a partial pressure of a film-forming gas and a heating temperature of a wafer in the film-forming apparatus.

FIG. 5 is a characteristic diagram illustrating saturated vapor pressure curves of the first film-forming gas and the second film-forming gas, in which the horizontal axis indicates a temperature and the vertical axis logarithmically indicates a pressure. In the drawing, the saturated vapor pressure curve of the first film-forming gas is indicated by a solid line and the saturated vapor pressure curve of the second film-forming gas is indicated by a dashed line. Furthermore, the saturated vapor pressure curves of the first film-forming gas and the second film-forming gas illustrated in FIG. 5 are schematically indicated and do not describe actual saturated vapor pressure curves of PMDA and ODA.

As described above with reference to FIG. 1, it is assumed that the first monomer and the second monomer react one to one to form a repetitive unit structure of polyimide. For example, a case where the saturated vapor pressure of the first film-forming gas is higher than the saturated vapor pressure of the second film-forming gas will be described as an example.

In this case, a film-forming process is first performed on a film-forming gas having a lower saturated vapor pressure (the first film-forming gas in the example illustrated in FIG. 5) under temperature and partial pressure conditions at which the film-forming gas can maintain a gaseous state. That is, in the example of FIG. 5, the film-forming process may be performed under the temperature and partial pressure conditions below the saturated vapor pressure curve of the first film-forming gas.

For example, in the case where the film-forming process is performed at a predetermined heating temperature which falls within a temperature range of the wafer W indicated by an alternate long and short dashed line in FIG. 5, the partial pressure of the first film-forming gas is allowed to increase the partial pressures of both film-forming gases as much as possible within a range of less than the saturated vapor pressure to increase the amount of the monomer colliding with the surface of the wafer W. This make it possible to increase the adsorption amount of the monomer as much as possible.

Furthermore, in the case where the film-forming process is performed at a predetermined film-forming gas partial pressure which falls within a partial pressure range indicated by a two-dot chain line in FIG. 5, similarly, the partial pressure of the first film-forming gas is allowed to lower the heating temperature as much as possible within a range of less than the saturated vapor pressure to reduce the desorption amount of the monomer. This makes it possible to reduce the desorption amount of the monomer and to lengthen the adsorption retention time.

In this manner, the supply amount of the low vapor pressure gas is set so that the partial pressure does not exceed the saturated vapor pressure of the low vapor pressure gas having a lower saturated vapor pressure.

On the other hand, with respect to a film-forming gas having a higher saturated vapor pressure (the second film-forming gas in the example illustrated in FIG. 5), it is considered that the high vapor pressure gas having stoichiometrically the same amount (with the equal partial pressure) as the low vapor pressure gas may be supplied. However, in the state where the partial pressures are equalized, the adsorption amount of the high vapor pressure gas to the wafer W may also be decreased compared with the low vapor pressure gas. Therefore, the high vapor pressure gas may be supplied in excess of the low vapor pressure gas within a partial pressure range that the saturated vapor pressure is not exceeded in some embodiments.

Furthermore, the method of setting the supply amounts (partial pressures) of the film-forming gases described above may similarly apply to a case where the film-forming gases are prevented from solidifying beyond a sublimation curve.

As described above, in the present embodiment, the angle θ formed by the gas supply nozzle 3 and the straight line drawn from the exhaust port 4 toward the center C of the rotary table 2 is set within the range of 30 to 90°. In other words, since the gas supply nozzle 3 and the exhaust port 4 are disposed at positions relatively close to each other, each film-forming gas discharged from the gas discharge holes 30 is discharged from the exhaust port 4 in a short time before it is dispersed over the entire space on the top side of the rotary table 2.

In order to perform film formation in this way during a period in which the time from the supply to the exhaust is short, in the schematic diagram described above with reference to FIG. 4, the amounts of the monomers colliding with the surface of the wafer W per unit time may be large in some embodiments. In addition, the probability that the monomers adsorbed to the wafer W will react with each other may be increased by lengthening the time (adsorption retention time) during which the monomers are adsorbed to the wafer W in some embodiments.

From the viewpoint of the former (the increase of the collision amount of the monomers per unit time), the filmfirming gases to be supplied may have a value close to the saturated vapor pressure in some embodiments. On the other hand, as described above, when the supply pressures of the film-forming gases exceed the saturated vapor pressure, the film-forming gases may be liquefied. Therefore, the supply pressures of the film-forming gases are controlled by focusing on the film-forming gas (low vapor pressure gas) having a lower saturated vapor pressure out of the first and second film-forming gases. That is, assuming that the saturated vapor pressure of the low vapor pressure gas is P0 and the partial pressure of the low vapor pressure gas supplied from the gas supply nozzle 3 is P1, the supply pressure of the low vapor pressure gas may be set so that values of P1/P0 are 1 or less and become values as high as possible in some embodiments.

On the other hand, as described above, when the saturated vapor pressure of the high vapor pressure gas is P0' and the partial pressure thereof is P1', the film-forming gas (high vapor pressure gas) having a higher saturated vapor pressure, out of the first and second film-forming gases, may be supplied at a partial pressure at which values of P1'/P0' are 1 or less and are higher than those of the low vapor pressure gas.

Furthermore, from the viewpoint of the latter (lengthening the adsorption retention time of the monomers), the temperature may be adjusted to a temperature at which the once adsorbed monomers are difficult to be desorbed by appropriately lowering the heating temperature of the wafer W.

Considering these viewpoints comprehensively, in this example, the heating temperature of the heaters 7 is set to heat the wafer W to a temperature at which a reaction efficiency E which is a ratio of a consumption amount of the film-forming gas to the supplied film-forming gas (based on the low vapor pressure gas) is 70% or higher and becomes, e.g., 90%.

Specifically, it is assumed that the supply flow rate of the low vapor pressure gas supplied from the gas supply nozzle 3 is L1, the exhaust flow rate of the corresponding film-forming gas reaching the exhaust duct 4 is L1', and the proportion of the film-forming gas consumed in the film-forming process is the reaction efficiency E (%). At this time, the amount of the film-forming gas consumed in the film-forming process can be obtained from a difference value between the supply flow rate L1 of the low vapor pressure gas and the exhaust flow rate L1' of the low vapor pressure gas. The heating temperature of the wafer W is set so that the reaction efficiency E expressed by the following equation (1) based on this concept becomes 70% or higher. Thus, it is possible to perform film formation in a short time until reaching the exhaust port by efficiently adsorbing and reacting the film-forming gas to and with the wafer W in a region to which the film-forming gas is supplied.

$$E(\%)=\{(L1-L1')/L1\}\times 100 \quad \text{Eq. (1)}$$

An operation of the film-forming apparatus of this example that forms a film of polyimide based on the concept described above will be described.

For example, six wafers W are mounted on the respective mounting parts 24 of the rotary table 2 by an external transfer mechanism (not shown), and the gate valve 16 is closed. The wafers W mounted on the mounting parts 24 are heated to a predetermined temperature, e.g., 140 degrees C., by the heaters 7. Subsequently, exhaust is performed by the vacuum pump 43 via the exhaust port 4, and the pressure (total pressure) of the interior of the vacuum container 10 is adjusted to, e.g., 50 Pa (0.4 Torr), by the $N_2$ gas supplied from the $N_2$ gas supply sources 52 and 62, and the rotary table 2 is rotated at, e.g., 10 to 30 rpm.

Subsequently, the first film-forming gas containing PMDA (low vapor pressure gas) is supplied at partial pressures of, e.g., 1.33 Pa (0.01 Torr) and the second film-forming gas containing ODA (high vapor pressure gas) is supplied at partial pressures of, e.g., 1.46 Pa (0.011 Torr) to the gas supply nozzle 3, while maintaining the aforementioned total pressure. These film-forming gases are merged and mixed in the introduction pipe at the upstream side of the gas supply nozzle 3, and are discharged from the gas supply nozzle 3 in a state heated to, e.g., 260 degrees C., which is a temperature higher than the film-forming inhibition temperature. The PMDA and ODA are continuously supplied during the film-forming process.

By the aforementioned operation, each wafer W rotating around the center C of the rotary table 2 repeatedly passes through the lower side of the gas supply nozzle 3. As a result, the PMDA as the first monomer contained in the first film-forming gas and the ODA as the second monomer contained in the second film-forming gas are simultaneously adsorbed to the surface of each wafer W. As a result, the PMDA and ODA reacts with each other on the surface of the wafer W to become polyimide and to form a film by depositing the polyimide.

At this time, as described above, in the film-forming apparatus according to the embodiment, the value of P1/P0 which is a ratio of the partial pressure P1 of the first and second film-forming gases to the saturated vapor pressure P0 of the low vapor pressure gas is set to be 1 or less. As a result, it is possible to perform the film-forming process in a short time until the film-forming gases are exhausted to the exhaust port 4 while preventing liquefaction of the low vapor pressure gas.

Figure 6:
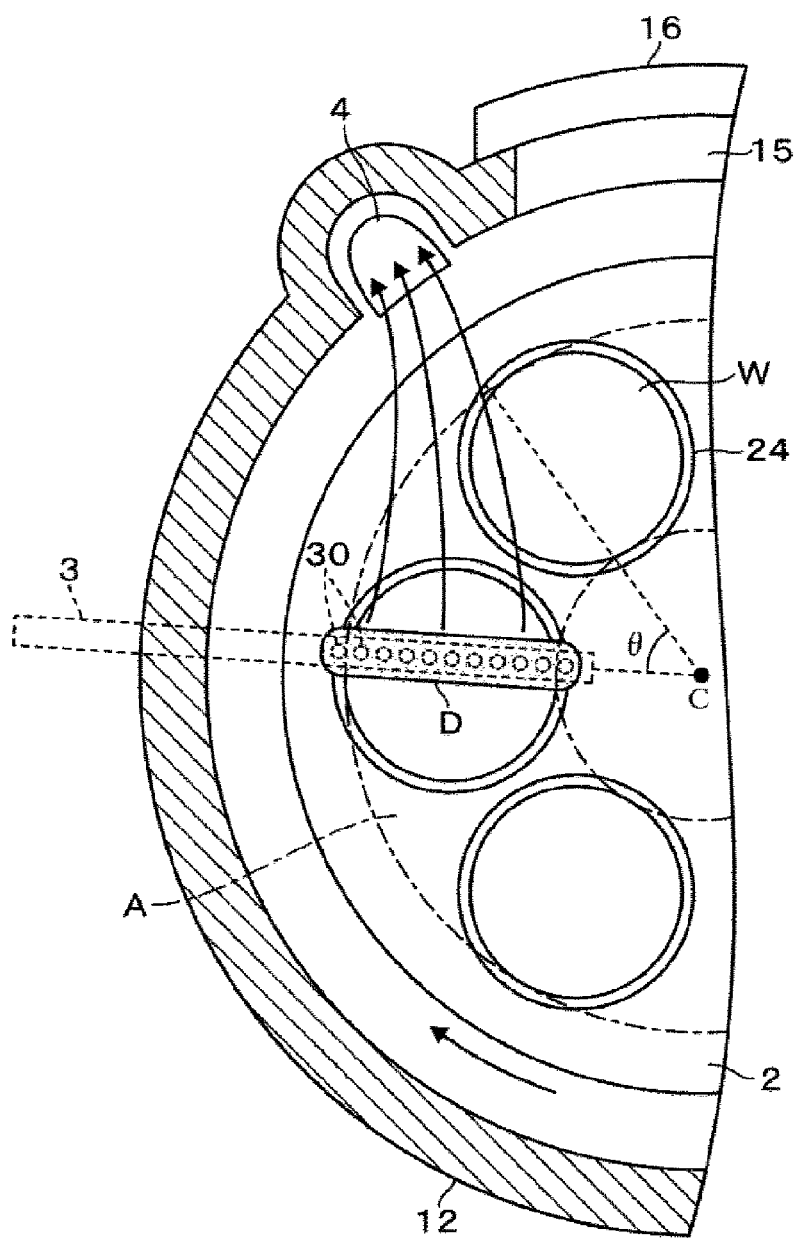
FIG. 6 is a longitudinal sectional view illustrating a supply region of a film-forming gas and a flow of the film-forming gas in the film-forming apparatus.

More specifically, as illustrated in FIG. 6, in the film-forming apparatus of this example, the gas supply nozzle 3 is disposed so as to cross the moving region A of the wafer W. In addition, the gas discharge holes 30 are provided on the lower surface of the gas supply nozzle 3 over a range from the center side to the peripheral side of the rotary table 2 crossing the moving region A. Furthermore, the heating temperature of the wafer W is set so that the reaction efficiency E of the first and second film-forming gases becomes 70% or higher.

Due to these configurations and film-forming conditions, most of the film-forming gases discharged from each discharge hole 30 is adsorbed and reaction proceeds near a region (referred to as a "region D" in FIG. 6) where the film-forming gases collide with the wafer W. As a result, polyimide is formed so as to scan the wafer W. Then, each wafer W repeatedly passes through the region D by rotating the rotary table 2 so that the polyimide is gradually deposited and film formation is performed.

In addition, under a condition in which the reaction temperature is set so that the reaction efficiency E becomes 70% or higher, most of the film-forming gases is adsorbed and consumed near the region D. Therefore, most of the gases flowing into the exhaust port 4 is a carrier gas.

As described above, the film-forming apparatus according to the present embodiment can efficiently form a film on the wafer W in the local region, and thus has high productivity.

Based on the aforementioned operation, when the film having a preset film thickness is formed, the supply of the film-forming gases, the rotation of the rotary table 2, and the heating of the wafer W are stopped, and the wafer W after the film-forming process is completed is unloaded in a reverse order of the loading, and then start of a next film-forming process is waited.

At this time, prior to starting the next film-forming process, for example, an $O_2$ gas as the cleaning gas is supplied into the vacuum container 10 and ultraviolet rays are also irradiated by the ultraviolet lamp 83. Therefore, a process of decomposing the film of polyimide formed in a region that is not covered by the wafer W other than the mounting part 24 may be performed by supplying the activated $O_2$ gas to the surface of the rotary table 2. Furthermore, the decomposition of the film formed on the rotary table 2 may be performed after performing a preset number of film-forming processes.

According to the aforementioned embodiment, the plurality of wafers W are mounted on the rotary table 2 and rotated, and the gas supply nozzle 3 having the gas discharge holes 30 for discharging the first film-forming gas and the second film-forming gas as the film-forming gases, which react with each other to form the film material, downward is prepared so as to face the moving region A of the wafers W. With this configuration, since the film-forming process can be continuously performed on the plurality of wafers W, the productivity is improved. Furthermore, the gas discharge holes 30 for discharging the film-forming gases toward the rotary table 2 are formed in the gas supply nozzle 3 so as to cross the moving region A over the range from the rotation center side to the peripheral side of the rotary table 2. With this configuration, uniformity in the thickness of a film formed on each of the wafers W in the diameter direction of the rotary table 2 is improved.

Figure 7A:
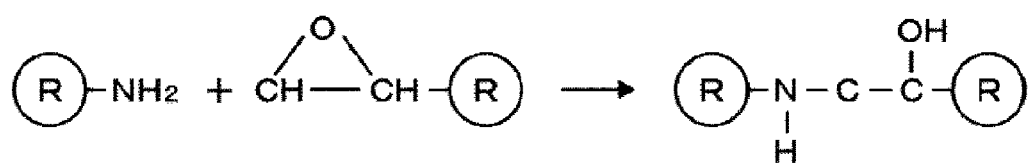
FIG. 7A is an explanatory view illustrating a first example of a film-forming gas according to an embodiment of the present disclosure.
Figure 7B:
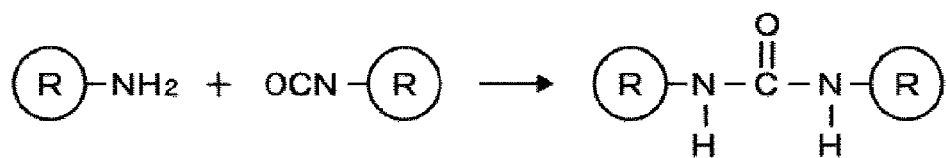
FIG. 7B is an explanatory view illustrating a second example of the film-forming gas.
Figure 7C:
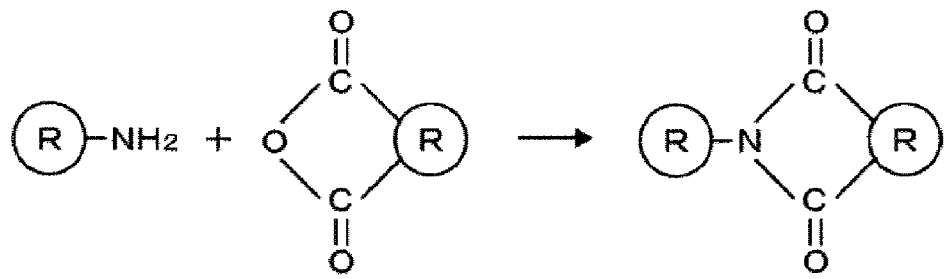
FIG. 7C is an explanatory view illustrating a third example of the film-forming gas.

Furthermore, as illustrated in FIG. 7A, the film formed by using the film-forming apparatus according to the embodiment may be formed by a film material having an epoxy bond by reacting a film-forming gas containing a monomer having an amino group with a film-forming gas containing a monomer having an epoxy group. Also, as illustrated in FIG. 7B, the film may be formed of a film material having a urea bond between a film-forming gas containing a monomer having an amino group and a film-forming gas containing a monomer having isocyanate. Alternatively, as illustrated in FIG. 7C, the film may be formed from a film material having an imide bond between a film-forming gas containing a monomer having an amino group and a film-forming gas containing a monomer as an acid anhydride. Furthermore, the film may be formed of a film material having a urethane bond between a film-forming gas containing a monomer as an alcohol and a film-forming gas containing a monomer as isocyanate, or a film material having an amide bond between a film-forming gas containing a monomer having an amino group and a film-forming gas containing a monomer as a carboxylic acid. Moreover, the film may be formed by forming a polymer by copolymerization, bimolecular reaction, tri-molecular reaction, or a mixture of three kinds.

The first film-forming gas and the second film-forming gas may form the film material by bonding monomers of bifunctional or higher to each other, in addition to monomers in which functional groups such as an isocyanate group and an amino group are monofunctional. Furthermore, aromatic series, alicyclic series, aliphatic series, a conjugate of aromatic series and aliphatic series, or the like may be used as a skeleton structure of a monomer for forming a film material.

Furthermore, in the film-forming apparatus according to the embodiment, a gas supply part for supplying the first film-forming gas and a gas supply part for supplying the second film-forming gas may be installed separately and independently from each other. Even in such a configuration, the same effects may be achieved by simultaneously supplying the first film-forming gas and the second film-forming gas to overlapping regions of the moving region A.

In addition, at this time, it is not essential that arrival positions of the first and second film-forming gases supplied from the individually provided two gas supply parts (a case where the gas supply nozzle 3 illustrated in FIG. 3 is arranged in two at positions adjacent to each other, or the like) to the surface of the wafer W overlap each other. For example, even in a case where the arrival positions of the respective film-forming gases are formed in regions adjacent to each other, when the film-forming gases after colliding with the wafer W flow into both arrival positions and adsorb to the wafer W, it can be said that these first and second film-forming gases are simultaneously supplied to overlapping regions of the moving region A.

In addition, the gas supply nozzle 3 in which a plurality of gas discharge holes 30 are provided over the range from the rotation center side to the peripheral side of the rotary table 2, and a plurality of pairs of exhaust ports 4 arranged in the range of the angle θ of 30 to 90°, when viewed from the gas supply nozzle 3, may be arranged in the vacuum container 10. For example, the gas supply nozzle 3 is arranged along the diameter of the rotary table 2, and a plurality of gas discharge holes 30 are respectively provided over ranges (radiuses of the rotary table 2) of both peripheral sides, when viewed from the rotation center side, and the exhaust ports 4 may be respectively provided at positions where the angle θ becomes 30 to 90°, when viewed from each radius.

In addition, the film as formed may be modified by irradiating the wafers W mounted on the rotary table 2 with ultraviolet rays by the aforementioned ultraviolet irradiation part 8. Alternatively, it may be configured so as to, instead of the ultraviolet irradiation part 8, remove the film material adhered to the rotary table 2 with heat by irradiating the surface of the rotary table 2 with infrared rays. Also, both an irradiation part for cleaning and an irradiation part for modifying the wafers W may be installed.

As discussed above, this disclosed embodiment should be considered not to be restrictive but to be illustrative in all respects. The aforementioned embodiment may be omitted, replaced, or modified in various forms without departing from the scope and spirit of the appended claims.

Figure 8:
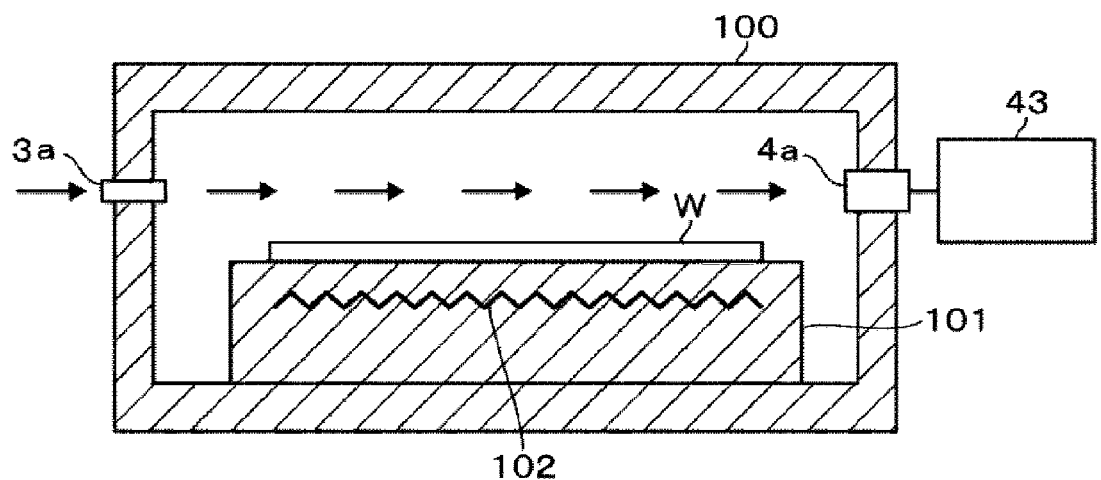
FIG. 8 is a longitudinal sectional view illustrating a film-forming apparatus used for a preliminary test.

Next, results of conducting a preliminary experiment to confirm that the film-forming gases supplied from the gas supply nozzle 3 are quickly adsorbed to the wafer W as illustrated in FIG. 6 will be described. As illustrated in FIG. 8, a single-wafer-type film-forming apparatus including a mounting table 101 on which a wafer W is mounted in a vacuum container 100, in which a heater 102 is embedded in the mounting table 101, was used for the preliminary experiment. In addition, it is configured so that a gas supply nozzle 3a for supplying a first film-forming gas (PMDA) and a second film-forming gas (ODA) may be installed on a sidewall of the vacuum container 100 to supply the film-forming gases in the lateral direction toward the surface of the wafer W mounted on the mounting table 101. On the other hand, an exhaust port 4a that forms an exhaust part is provided at a position opposite to a direction in which the film-forming gases are discharged from the gas supply nozzle 3 with the mounting table 101 interposed therebetween.

Using this film-forming apparatus, a film-forming process was performed by setting the temperature of the wafer W at each of 140, 160, 180, and 200 degrees C. respectively to investigate a film thickness distribution at a position along a straight line extending in the discharge direction of the film-forming gases and passing through the center of the wafer W. Furthermore, the pressure of the interior of the vacuum container 100 and the partial pressures of the first and second film-forming gases were set similar to those of the film-forming apparatus according to the embodiment described above with reference to FIGS. 2 and 3, and a sequence in which the first and second film-forming gases are mixed and then continuously supplied from the gas supply nozzle 3a in the same manner as the embodiment was used as a supply sequence of these film-forming gases.

Figure 9:
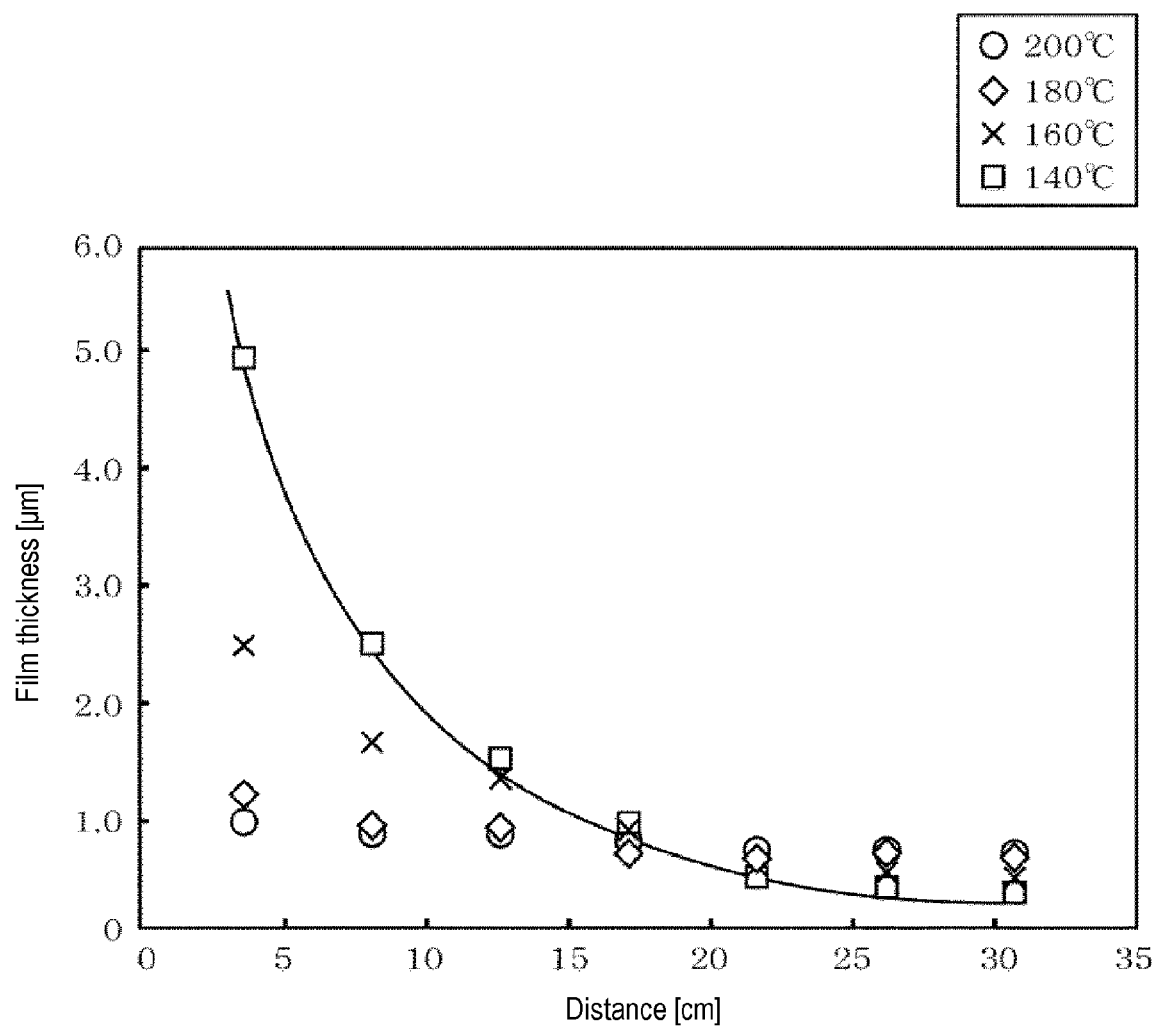
FIG. 9 is a characteristic diagram illustrating a film thickness of a film as formed with respect to a distance from a gas supply nozzle for each temperature in the preliminary test.

FIG. 9 is a characteristic diagram illustrating a film thickness distribution when the heating temperature of the wafer W was set at each of 140, 160, 180, and 200 degrees C. respectively. In FIG. 9, the horizontal axis indicates a distance from the discharge position of the film-forming gases and the vertical axis indicates a film thickness of polyimide formed at each position.

As illustrated in FIG. 9, it can be seen that the thickness of a film formed on the wafer W is decreased at any heating temperature as a distance from the gas supply nozzle 3 increases. For example, when the heating temperature of the wafer W is 140 degrees C., which is the lowest, the thickness of the film formed on the wafer W is larger than that at other heating temperature in a region close to the discharge position from the gas supply nozzle 3 and is sharply decreased as the distance from the discharge position increases. This is because, as described above with reference to FIG. 5, when the heating temperature is relatively low, the desorption amount of monomers adsorbed to the wafer W is reduced, such that the film in the region close to the discharge position becomes thick while the amount of monomers in the film-forming gases flowing into the downstream side is sharply decreased and the film is thinned accordingly.

On the other hand, when the heating temperature of the wafer W is raised to, e.g., 200 degrees C., the film thickness is decreased so as to draw a primary straight line with respect to the distance from the discharge position, but its decrease amount is small. This is because the desorption amount of monomers from the wafer W is increased as the heating temperature is raised. Furthermore, it is considered that even if the distance from the gas supply nozzle 3 becomes longer due to an increase in the desorption amount of the monomers from the wafer W, the film-forming gases are likely to remain in the gas, and thus can be said that it is easy to form a film even at any position separated from the gas supply nozzle 3.

By changing the heating temperature of the wafer W in this way, the film thickness distribution of the film formed on the wafer W can be changed. In addition, when the PMDA and ODA are used as the first film-forming gas and the second film-forming gas, it could be confirmed that, by setting the heating temperature of the wafer W at about 140 degrees C., the thickness of the film formed at the supply position of the film-forming gases may be increased and the thickness of the film as formed may be sharply decreased as it is separated from the supply position. Furthermore, even in the case where other monomers are used as the first and second monomers, the relationship between the distance from the discharge position of the film-forming gases and the film thickness can be adjusted in the same manner as the example illustrated in FIG. 9 by setting an appropriate heating temperature according to a reaction energy. Accordingly, when the film-forming process is performed by using the gas supply nozzle 3 according to the embodiment described above with reference to FIGS. 3 and 6, it can be said that, by appropriately selecting the heating temperature of the wafer W, the film-forming process can proceed near the region D where the film-forming gases collide.

According to the present disclosure in some embodiments, it is possible to provide a technique for enhancing productivity and improving in-plane and inter-plane uniformities of film thickness of a film formed on a substrate, in a film-forming apparatus in which a film made of a film material is formed by supplying film-forming gases that react with each other to become the film material to the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming apparatus, comprising:
  a process container in which a vacuum atmosphere is formed;
  a rotary table installed in the process container, the rotary table having substrate mounting regions formed on a side of a top surface of the rotary table and configured to mount a plurality of substrates, and the rotary table including a rotary mechanism configured to rotate the substrate mounting regions around a rotary shaft;
  a heating mechanism configured to heat the plurality of substrates mounted on the substrate mounting regions;
  a gas supply part installed to face a moving region where the plurality of substrates move when the rotary table rotates and including gas discharge holes formed to cross the moving region over a range from a rotation center side to a peripheral side of the rotary table, the gas discharge holes being configured to discharge a first film-forming gas and a second film-forming gas toward a side of the rotary table, and the first film-forming gas and the second film-forming gas being adsorbed to surfaces of the plurality of substrates heated by the heating mechanism and reacting with each other to form a film material;
  an exhaust part configured to exhaust an interior of the process container; and
  an ultraviolet irradiation part installed on a ceiling surface side of the process container and configured to irradiate the side of the rotary table with light for film-processing,
  wherein the first film-forming gas and the second film-forming gas are simultaneously supplied to overlapping regions of the moving region, and
  wherein the ultraviolet irradiation part includes a lamp house, an ultraviolet lamp arranged inside the lamp house, and a transmission window formed on the ceiling surface side.

2. The apparatus of claim 1, wherein, when, out of the first film-forming gas and the second film-forming gas, a saturated vapor pressure of a low vapor pressure gas having a lower saturated vapor pressure is P0, a saturated vapor pressure of a high vapor pressure gas having a higher saturated vapor pressure is P0', and partial pressures of the low vapor pressure gas and the high vapor pressure gas are respectively P1 and P1', a supply pressure of each of the first film-forming gas and the second film-forming gas is set so that P1/P0 is 1 or less, and P1'/P0' is 1 or less and becomes a value higher than P, and wherein the heating mechanism is configured to heat the plurality of substrates to a temperature at which a reaction efficiency, which is a ratio of a consumption amount to a supply amount of each of the first film-forming gas and the second film-forming gas, becomes 70% or higher.

3. The apparatus of claim 1, wherein the ultraviolet irradiation part is configured to activate a cleaning gas supplied through the gas supply part to clean a film adhered to a surface of the rotary table.

4. The apparatus of claim 1, wherein the ultraviolet irradiation part is configured to modify the film material.

* * * * *

UNITED STATES PATENT AND TRADEMARK OFFICE
CERTIFICATE OF CORRECTION

PATENT NO.         : 11,136,668 B2
APPLICATION NO.    : 16/390903
DATED              : October 5, 2021
INVENTOR(S)        : Tatsuya Yamaguchi, Reiji Niino and Yoji Iizuka It is certified that error appears in the above-identified patent and that said Letters Patent is hereby corrected as shown below:

In the Claims

Claim 2, Column 15, Line 4, please remove the phrase "a value higher than P, and" and replace with "a value higher than P1, and".

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*